United States Patent [19]

Pelc et al.

[11] Patent Number: 4,706,026
[45] Date of Patent: Nov. 10, 1987

[54] METHOD FOR REDUCING IMAGE ARTIFACTS DUE TO PERIODIC SIGNAL VARIATIONS IN NMR IMAGING

[75] Inventors: Norbert J. Pelc, Wauwatosa; Gary H. Glover, Waukesha, both of Wis.

[73] Assignee: General Electric Company, Milwaukee, Wis.

[21] Appl. No.: 766,842

[22] Filed: Aug. 16, 1985

[51] Int. Cl.$^4$ .............................................. G01R 33/20
[52] U.S. Cl. .................................................... 324/309
[58] Field of Search ............... 324/300, 307, 309, 311, 324/312, 314; 120/653

[56] References Cited

U.S. PATENT DOCUMENTS

| | | | |
|---|---|---|---|
| 4,516,582 | 5/1985 | Redington | 324/309 |
| 4,523,596 | 6/1985 | Macovski | 128/653 |
| 4,549,140 | 10/1985 | MacFall | 324/312 |
| 4,567,893 | 2/1986 | Charles | 128/653 |
| 4,612,504 | 9/1986 | Pelc | 324/314 |
| 4,614,195 | 9/1986 | Bottomley | 324/309 |
| 4,616,180 | 10/1986 | Compton | 324/309 |

OTHER PUBLICATIONS

C. L. Schultz et al., "The Effect of Motion on Two-Dimensional Fourier Transformation Magnetic Resonance Images,", Radiology 1984, pp. 117–121.
D. R. Bailes et al., "Respiratory Ordered Phase Encoding (ROPE): A Method for Reducing Respiratory Motion Artefacts in MR Imaging," Journal of Computer Assisted Tomography, vol. 9, No. 4, pp. 835–838, 1985.
B. Vinocur, "Motion-Reduction Software Brightens Outlook for Body MRI," Diagnostic Imaging, pp. 79, 82 and 84, 8/85.

Primary Examiner—Michael J. Tokar
Attorney, Agent, or Firm—Mark L. Mollon; Douglas E. Stoner

[57] ABSTRACT

A method for reducing image artifacts due to periodic motion of a subject undergoing examination by nuclear magnetic resoance (NMR) techniques includes the acquisition of scan data for imaging the object. The scan data is composed of a number of views. The acquisition of each view includes the generation of an NMR signal and the application of a magnetic gradient along at least one dimensional axis of the object. The magnetic field gradient is characterized by a parameter value (e.g., amplitude or direction) adjustable from view to view to encode spatial information into the NMR signal. The method includes the step of selecting the value of the adjustable parameter value for each view. A view order is then selected so as to attempt to obtain a predetermined relationship between the object motion and the adjustable parameter of the magnetic field gradient. The relationship is chosen to minimize artifacts in the reconstructed image. The method is applicable to various NMR imaging techniques, including Fourier Transform and multiple angle projection reconstruction.

34 Claims, 17 Drawing Figures

METHOD FOR REDUCING IMAGE ARTIFACTS DUE TO PERIODIC SIGNAL VARIATIONS IN NMR IMAGING

BACKGROUND OF THE INVENTION

This invention relates to nuclear magnetic resonance (NMR) imaging methods. More specifically, this invention relates to method for controlling image artifacts due to periodic NMR signal variations due, for example, to subject motion in the course of an NMR scan.

In the recent past, NMR has been developed as an imaging modality utilized to obtain images of anatomical features of human patients, for example. Such images depicting nuclear spin distribution (typically, protons associated with water and tissue), spin-lattice relaxation time $T_1$, and/or spin-spin relaxation time $T_2$ are believed to be of medical diagnostic value in determining the state of health of the tissue examined. Imaging data for constructing NMR images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the NMR signal. As is well known, the NMR signal may be a free induction decay (FID) or, preferably, a spin-echo signal.

The preferred embodiments of the invention will be described in detail with reference to a variant of the FT technique, which is frequently referred to as "spin warp." It will be recognized, however, that the method of the invention is not limited to FT imaging methods, but may be advantageously practiced in conjunction with other techniques, such as multiple angle projection reconstruction disclosed in U.S. Pat. No. 4,471,306, and another variant of the FT technique disclosed in U.S. Pat. No. 4,070,611. The spin-warp technique is discussed in an article entitled "Spin Warp NMR Imaging and Applications to Human Whole-Body Imaging" by W. A. Edelstein, el al., *Physics in Medicine and Biology*, Vol. 25, pp. 751–756 (1980). Briefly, the spin-warp technique employs a variable amplitude phase encoding magnetic field gradient pulse prior to the acquisition of NMR spin echo signals to phase encode spatial information in the direction of this gradient. In a two-dimensional implementation (2DFT), spatial information is encoded in one direction by applying a phase-encoding gradient along that direction and then observing a spin-echo signal in the presence of a magnetic field gradient in a direction orthogonal to the phase-encoding direction. The gradient present during the spin echo encodes spatial information in the orthogonal direction. In a typical 2DFT pulse sequence, the magnitude of the phase-encoding gradient pulse is incremented monotonically in the temporal sequence of views.

Although it has been known that some NMR imaging pulse sequences produce artifacts due to object motion, early in the development of NMR imaging it was believed that among the advantages of the FT imaging method was its property of not producing motion artifacts. However, it is now well recognized that this is not so. Object motion during the acquisition of an NMR image produces both blurring and "ghosts" in the phase-encoded direction. Ghosts are particularly apparent when the motion is periodic, or nearly so. For most physiological motion, including cardiac and respiratory motion, each NMR spin echo or FID can be considered a snapshot view of the object. Blurring and ghosts are due to the inconsistent appearance of the object from view to view.

Both deleterious effects of periodic motion, blurring and ghosts, can be reduced if the data acquisition is synchronized with the periodic motion. This method is known as gated scanning. Gating can also be used to study the mechanical dynamics of the motion itself, it that is of interest. The drawback of gating is that, depending on the period of the motion the fraction of the period during which acceptable data can be acquired, and the shortest acceptable pulse sequence repetition time, gating can significantly lengthen the data acquisition time.

While gating is required when the blurring due to the motion is unacceptable and when the motion itself is of interest (e.g., cardiac motion or flow), there are other applications where the loss of detail of the moving structures can be tolerated, but the disturbing effects of the ghosts which can extend far from the moving object cannot be accepted. In such applications, a method that can reduce or eliminate ghosts without the restrictions of gating is needed.

Ghost artifacts similar in character to those due to motion of the object portion being imaged can be caused by other substantially periodic variation in the NMR signals. Variations in the amplitude or phase of the received signals may be caused by changes in the RF coil loading due to motion of objects not under examination. Signal variations may also be caused by noise sources, e.g., line frequency noise whose phase varies from view to view in a substantially periodic manner. Reduction of these artifacts is also of interest and is within the scope of the present invention. Collectively, signal variations due to motion of the object being imaged as well as due to the indirect causes described above will be referred to hereinafter as signal variations.

One proposed method for eliminating ghost artifacts is disclosed and claimed in U.S. patent application Ser. No. 673,690, filed Nov. 21, 1984, and which is assigned to the same assignee as the present invention. In this case, it is recognized that the distance between the ghosts and the object imaged is maximized when the pulse sequence repetition time is an odd multiple one-fourth of the motion period (if two phase-alternated RF excitation pulses per view are used, as disclosed and claimed in commonly assigned U.S. Pat. No. 4,443,760, issued Apr. 17, 1984). In the above-identified patent application, it is recognized that this ratio can be used to alleviate ghosts due to respiratory motion. While this method, indeed, improves image quality, it does impose a constraint on the pulse sequence repetition time used and usually results in a longer scan time.

With the projection reconstruction imaging techniques, substantially periodic motion again causes local distortion and blurring, as well as artifacts that extend well away from the moving structure. In this technique, the artifacts are manifested as streaks rather than ghosts. Once again, a method of reducing the distant effects can be of significant benefit.

Accordingly, it is a principal object of the present invention to provide a method which is effective in achieving ghost artifact reduction or elimination while allowing complete freedom on the choice of pulse sequence repetition time.

SUMMARY OF THE INVENTION

In accordance with the invention, there is disclosed and claimed a method for reducing artifacts in a desired image due to substantially periodic variation in the received NMR signals caused, for example, by motion of at least a portion of an object undergoing examination by means of nuclear magnetic resonance techniques. The technique includes the acquisition of scan data for imaging the object portion. The scan data is composed of a plurality of views. The acquisition of each of the views includes irradiation of the object portio by an RF excitation pulse at the Larmor frequency to produce an NMR signal, and application of a magnetic field gradient pulse along at least one dimensional axis of the object. The magnetic field gradient pulse is characterized by a parameter value adjustable from view to view so as to encode spatial information into the NMR signal. The method includes the steps of determining the period of the motion of the object portion undergoing the examination and selecting the view increment time $T_v$ (to be defined below). These steps are followed by the selection of a view order so as to attempt to obtain a predetermined relationship between the motion of the object portion and the adjustable parameter of the magnetic field gradient pulse. The relationship is chosen so as to minimize artifacts in the reconstructed image.

BRIEF DESCRIPTION OF THE DRAWINGS

The features of the invention believed to novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
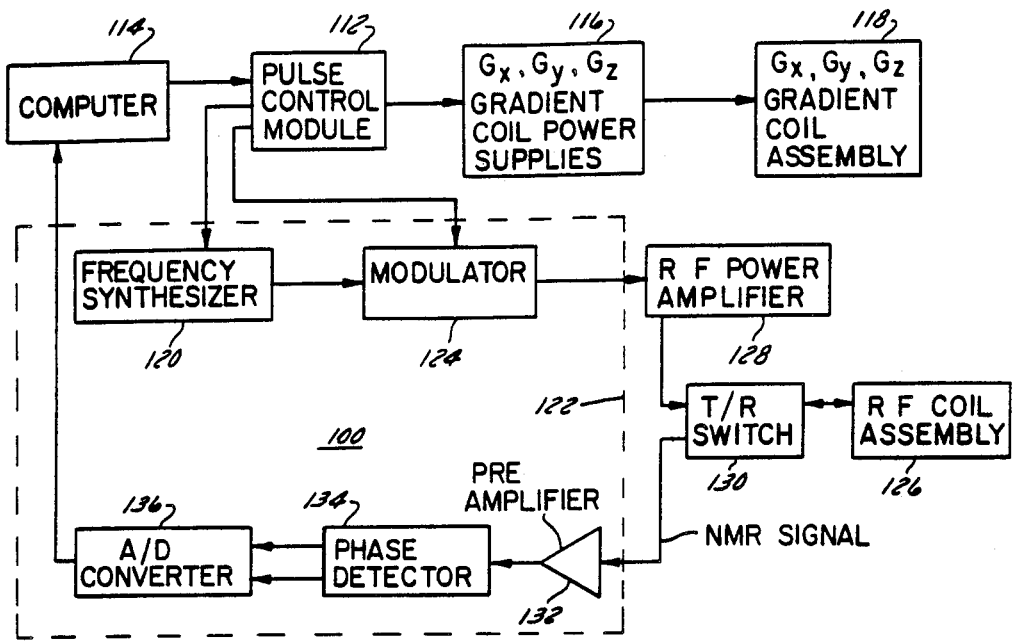
FIG. 1 depicts in block schematic form an exemplary NMR system useful for practicing the invention.

FIG. 1 is a simplified block diagram of an NMR imaging system with respect to which the preferred embodiment of the invention will be disclosed. It will be recognized, however, that the invention as claimed may be advantageously practiced with any suitable MR apparatus. The system, generally designated 100, includes a pulse control module 112 which provides properly timed pulse waveform signals, under the control of a host computer 114, to magnetic field gradient power supplies collectively designated 116 which energize gradient coils forming part of a gradient coil assembly generally indicated by a block 118. The assembly contains coils which, when energized by the power supplies, produce the $G_x$, $G_y$, and $G_z$ magnetic field gradients directed in the x, y, and z directions, respectively, of the Cartesian coordinate system. The use of the $G_x$, $G_y$ and $G_z$ gradients in NMR imaging applications will be described hereinafter with reference to FIG. 2.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulated RF signals are applied to an RF coil assembly 126 through an RF power amplifier 128 and a transmit/receive switch 130. The RF signals are used to excite nuclear spins in a sample object (not shown) undergoing examination.

The NMR signals from the excited nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct NMR images of the sample.

As used herein, a view will be defined as being a set of NMR measurements made with the same position-encoding gradients. Thus, a view may contain measurements obtained with the sign of the 90° RF pulses alternated, or repeat measurements to improve the signal-tonoise ratio. During a scan, a discrete set of the magnetic field gradient values are used to provide spatial information. The component signals for one view need not be acquired sequentially in time although this is usually the case.

Figure 2:
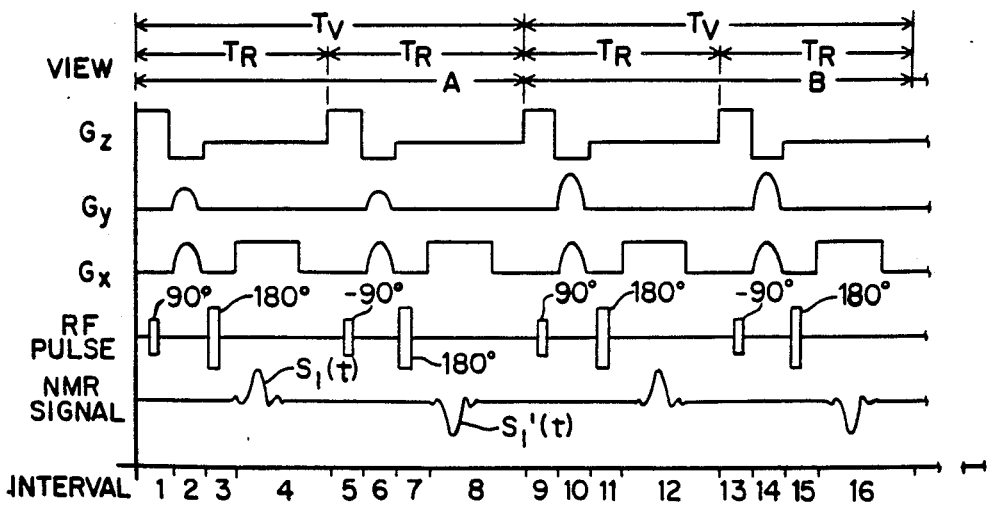
FIG. 2 depicts an exemplary imaging pulse sequence of the type known as two-dimensional Fourier transform.

Initial reference is made to FIG. 2 which depicts two views of what can now be referred to as a conventional imaging pulse sequence of the type known as two-dimensional Fourier transform (2DFT), which is frequently also referred to as two-dimensional "spin warp." This pulse sequence is useful in obtaining, in a well-known manner, imaging data to reconstruct images of a sample being investigated. The pulse sequence utilizes phase-alternated RF excitation pulses which, as disclosed and claimed in the aforeidentified U.S. Pat. No. 4,443,760 and as will be briefly described hereinbelow, produce phase-alternated NMR signals used to cancel certain baseline errors.

The manner in which this is accomplished in the conventional pulse sequence will now be described with reference to FIG. 2 which depicts two phase-encoding views A and B of a pulse sequence which in practice can contain, for example, 128, 256, or 512 phase-encoding views. Each view in FIG. 2 is comprised of two NMR experiments. Referring now to View A in FIG. 2, there is shown in interval 1 (indicated along the horizontal axis) a selective 90° RF excitation pulse applied in the presence of a positive $G_z$ magnetic field gradient pulse. Pulse control module 112, FIG. 1, provides the needed control signals to the frequency synthesizer and modulator so that the resulting excitation pulse is of the correct phase and frequency to excite nuclear spins only in a predetermined region of the sample. Typically, the excitation pulse can be amplitude modulated by a (sin x)/x function. The frequency of the synthesizer is dependent on the strength of the applied magnetic field and the NMR species being imaged in accordance with the well-known Larmor equation. The pulse control module also applies activating signals to the gradient power supplies to generate, in this case, the $G_z$ gradient pulse.

Continuing with reference to FIG. 2, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the gradient waveform over interval 1. The function of the negative $G_z$ pulse is to rephase the nuclear spins excited in interval 1. The $G_y$ gradient pulse is a phase-encoding pulse selected to have a different amplitude in each of Views A, B, ..., etc., to encode spatial information in the direction of the gradient. The number of different $G_y$ gradient amplitudes is typically selected to equal at least the number of resolution elements the reconstructed image will have in the phase-encoding (Y) direction. Typically, 128, 256 or 512 different gradient amplitudes are selected. In the spin warp embodiment of FT imaging, the duration of the $G_y$ gradient pulse is held constant while the amplitude is sequenced through a range of values. It will be recognized, however, that the degree of phase encoding is in reality a function of the time integral of the gradient pulse waveform which in this case is proportional to the amplitude of the gradient pulse.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin echo is produced typically by the application of a 180° RF pulse in interval 3. As is known, the 180° RF pulse is a time-reversal pulse which reverses the direction of spin dephasing so as to produce the spin-echo signal. The spin-echo signal is sampled in interval 4 in the presence of a linear $G_x$ gradient pulse to encode spatial information in the direction of this gradient.

In the pulse sequence of FIG. 2, baseline error components are eliminated by using an additional NMR experiment in View A. This second experiment is substantially identical to the first with the exception that the RF excitation pulse in interval 5 of View A is selected to be 180° out of phase (as suggested by the minus sign) relative to the excitation pulse in interval 1 of View A, so that the resulting spin-echo signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components cancel.

The process described above with reference to View A is repeated for View B and so on for all amplitudes of the phase-encoding $G_y$ gradient. The two experiments with excitation pulses 180° out of phase in each view will be referred to as a "chopper" pair. The use of the pulse sequence depicted in FIG. 2 to eliminate baseline error components necessarily means that the minimum number of excitations or NMR experiments per view is two which results in an increase in the signal-to-noise ratio by a factor of $\sqrt{2}$ over what it would be if a single excitation were used.

It should be noted the invention could also be practiced with three-dimensional Fourier transform techniques. U.S. Pat. No. 4,431,968, assigned to the same assignee as the present invention and which is incorporated herein by reference, discloses and claims three-dimensional Fourier transform techniques. Briefly, in three-dimensional Fourier transform NMR imaging techniques, phase-encoding gradients are applied in more than one dimension. For these techniques, additional $G_z$ phase-encoding gradient pulses are added to interval 2 of FIG. 2, for example, and the excitation/-sampling process described hereinabove is repeated in subsequent views of the pulse sequence until the $G_y$ and $G_z$ gradients are all sequenced through their complete range of amplitudes before the spatial image is complete. Accordingly, although specific reference is made hereinbelow to methods for sequencing $G_y$ in two-dimensional Fourier transform techniques, it is understood that the same sequencing methods are equivalently applicable to other gradient components when applied for phase-encoding purposes in three-dimensional Fourier transform techniques.

Figure 3:
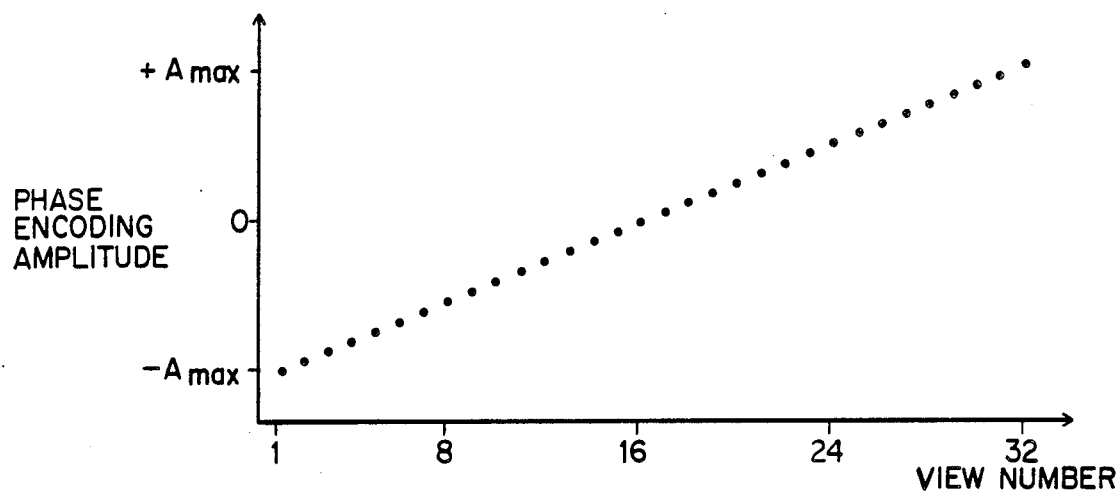
FIG. 3 illustrates a conventional sequence for incrementing the amplitude of the phase-encoding gradient in a pulse sequence such as the one shown in FIG. 2.

FIG. 3 depicts a conventional sequence for incrementing the amplitude (indicated along the vertical axis) of the $G_y$ phase-encoding gradient in adjacent views (indicated along the horizontal axis) of a two-dimensional spin-warp pulse sequence, such as the exemplary sequence described with reference to FIG. 2. In FIG. 3, each dot represents one $G_y$ gradient amplitude. For simplicity, a 32-view scan is assumed in FIG. 3. Typically, the scan would have, for example, 128 views and in view 1, the $G_y$ gradient is selected to have a predetermined negative amplitude ($-A_{max}$). Subsequently, in views 2-63, the amplitude is increased monotonically through a value of near 0 at view 64 and thence further increased monotonically to a positive amplitude ($+A_{max}$) at view 128.

As alluded to hereinabove, it has been found that quasi-periodic motion of the subject due, for example, to respiration, when using the phase-encoding amplitude sequence of FIG. 3, leads to structured artifacts (manifested in reconstructed images as discrete ghost images along the phase-encoding direction) and loss of resolution. The primary source of these artifacts has been determined to be motion-induced phase and amplitude errors in the phase-encoding direction when using FT imaging techniques. Specifically, to the extent that the motion is a periodic function of phase-encoding, the artifact will appear as discrete ghost or ghosts, replicating some of the features of the desired image.

Prior to describing how blurring and ghost artifacts due to object motion are reduced or eliminated in accordance with the invention, it will be instructive to consider the following discussion of the causes of these artifacts.

A simple way to understand motion-induced artifacts in FT imaging is not by dealing with motion directly, but by considering a small volume fixed in space whose NMR signal is a function of time. This small volume will be referred to herein as a pixel even though it is actually a region in space rather than a portion of the reconstructed image, and its NMR signal will be referred to as brightness. The temporal variation in brightness could be due to, for example, material moving into and out of the small volume fixed in space. In-plane motion causes brightness to increase in one pixel while it decreases in another. Note that by treating amplitude variations, not only can rigid motion be understood, but any other type as well. As was discussed hereinabove, variations in the NMR signal produced by effects other than motion can also generate ghost artifacts. These are included within the scope of the present discussion. Regardless of cause of brightness variation, due to the linearity of the imaging process, each pixel can be treated independently. Further, since it can be assumed that each view is an instant snapshot, only the column in the image in the phase-encoding direction containing the pixel of interest need be considered.

Thus, assume the object is only a function of one dimension (the phase-encoded direction, e.g., y), that only a single point at $y_o$ has any intensity, and for now, assume it has constant brightness $B_o$. Then, the object is $$o(y) = B_o \delta(y - y_o), \quad (1)$$

where $\delta$ is a DiraC delta function.

The measurements made in the FT imaging method form the Fourier transform of object o:

$$O(k_y) = \mathcal{F}[o(y)] = B_o e^{-2\pi i k_y y_o}, \quad (2)$$

where $k_y$ is a spatial frequency in the y direction, which, for 2DFT imaging, is proportional to the area under the phase-encoding gradient pulse. If variations in the object's brightness are now allowed so that when the measurement at $k_y$ is made the pixel brightness is $B_o + B(k_y)$, where $B_o$ is the average value, then the measured signal is:

$$H(k_y) = [B_o + B(k_y)] e^{-2\pi i k_y y_o}, \quad (3)$$

$$= B_o e^{-2\pi i k_y y_o} + B(k_y) e^{-2\pi i k_y y_o}. \quad (4)$$

Note that the error term, the second term on the right-hand side, is the Fourier transform of the single point modulated by brightness variation.

The resulting image in the inverse Fourier transform of H:

$$h(y) = \mathcal{F}^{-1}\{B_o e^{-2\pi i k_y y_o}\} + \mathcal{F}^{-1}\{B(k_y) e^{-2\pi i k_y y_o}\}. \quad (5)$$

The first term on the right-hand side is the desired image of the average object brightness. Using the convolution theorem on the second term results in:

$$h(y) = B_o \delta(y - y_o) + \delta(y - y_o) * g(y), \quad (6)$$

where g(y) is the ghost kernal which is equal to the inverse Fourier transform of the temporal variation and * denotes a convolution. The word "temporal" is used here to define how the brightness amplitude varies with phase-encoding amplitude $k_y$ rather than time. For now, it may be assumed that phase-encoding amplitude is proportional to time, as it is in a conventional imaging sequence (FIG. 3). Thus, $$g(y) = \mathcal{F}^{-1}[B(k_y)]. \quad (7)$$

The first term on the right-hand side of Equation (6) describes motion blurring. As the object moves, each point in the image through which the object passes will receive a contribution proportional to the amount of time the object spent at that point throughout the imaging sequence (throughout the measurements, to be precise). The second term in Equation (6) shows that whatever temporal variations there are at a point will produce ghosts. The ghosts emanate in the phase-encoding direction from the source. The details of the ghosts depend on the frequency content of the temporal variations.

Figure 4:
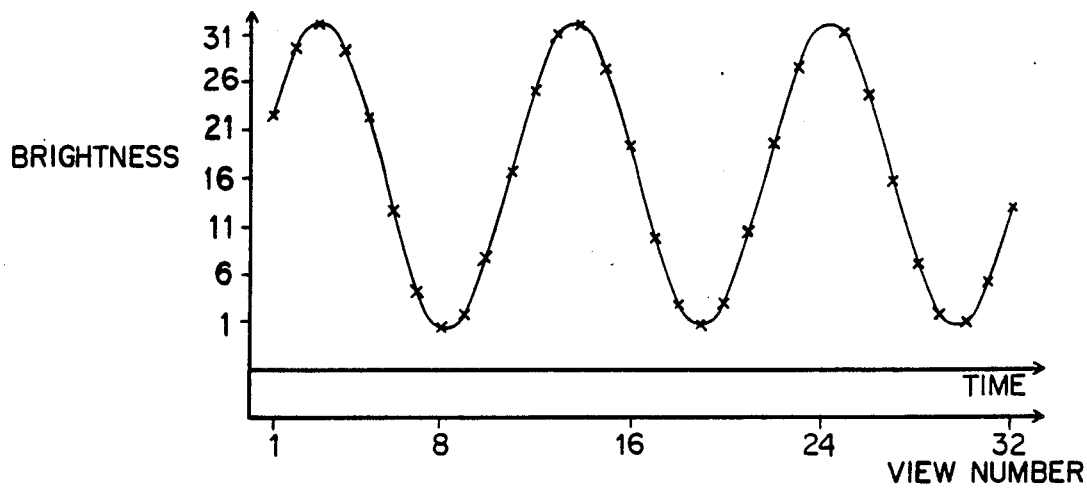
FIG. 4 depicts object brightness versus time for an object whose amplitude is varying sinusoidally as a function of time.

Suppose that the function $B(k_y)$ is a sinusoid. FIG. 4 shows a plot of the object brightness (vertical axis) versus time. The set of points designated by "X" marks in FIG. 4 are the object brightness at each of the discrete times a view measurement is taken. In practice, this function may have many cycles during one scan; e.g., 10–20 or more, depending on, for example, the respiration rate of the subject being imaged and the time required to collect all of the scan data. For simplicity, FIG. 4 depicts only three cycles. Function $B(k_y)$ may be expressed as:

$$B(k_y) = \Delta B \sin(2\pi f^* k_y + \phi), \quad (8)$$

where f* is the frequency in brightness cycles per spatial frequency ($k_y$) increment and $\phi$ is the phase. To make this more intuitive, the frequency f* may be converted to brightness cycles per scan. Assume there are $N_v$ views, that the field of view is FOV so that the frequency increment is 1/FOV. The frequency in cycles per scan then is:

$$f = f^* (1/FOV) N_v. \quad (9)$$

Using Equation (9) for the sine wave of Equation (8) and substituting into Equation (7), the ghost kernal is:

$$g(y) = \frac{\Delta B}{2} \{[\sin(\phi) + i \cos(\phi)] \delta(y - f FOV/N_v)\} + \quad (10)$$

-continued $$\frac{\Delta B}{2} \{[\sin(\phi) - i \cos(\phi)] \delta(y + f FOV/N_v)\}$$

Thus, the ghost kernel for simple sinusoidal brightness variation causes there to be two ghosts emanating from the source pixel. The first term produces a ghost above the source pixel while the second produces a ghost below the source pixel. It will be recognized that in an actual image, many points in the image may be producing ghosts. In practice, strong ghost artifacts are observed emanating from moving high contrast boundaries.

The distance between the object pixel and the ghosts is determined by the frequency of the relationship between brightness and phase encoding. As the frequency of the motion increases, the ghosts move farther away from the source pixel. Since there are a finite number of views, the observed frequency cannot be greater than $N_v/2$ cycles per scan. If the actual frequency is greater, it will simply alias to a lower frequency. Thus, from Equation 10, it may be seen that the farthest the ghost can be from the source pixel is one half of the field of view. At frequencies just higher than that, the frequency will be aliased to just below $N_v/2$ and as the frequency increases further, the ghosts will come closer to the source pixel. At a frequency of $N_v$ cycles per scan the ghosts will be superimposed on the source pixel. This condition is known as gating. Another constraint is that the ghosts cannot extend beyond the scanned field of view. If a ghost tries to do that, it will alias and reappear at the opposite extreme of the scanned field. For example, if $y_o+f$ FOV/$N_v$ exceeds (FOV/2) the upper ghost given by the first term in Equation (10) will wrap around and appear at the bottom of the image. Then, as $f$ increases, that particular ghost will move toward the image center. Note that the lower ghost at $(y_o-f$ FOV/$N_v)$ may still be at its expected location, so in this case both ghosts could be below the source pixel.

Note in Equation (10) that the two ghosts have a complex amplitude. The phase of each depends on the phase of the sinusoid. In general, the phase of the one ghost is different from the phase of the other and also from the phase of the desired image.

If the brightness variation is more complicated than a single sinusoid, the ghost kernel Equation (7) will also be more complicated and as a result more than 2 ghosts will emanate from the source pixel. In general, for substantially periodic variations, a series of discrete ghosts will be produced, one pair for each harmonic of the basic variation frequency.

Figure 5:
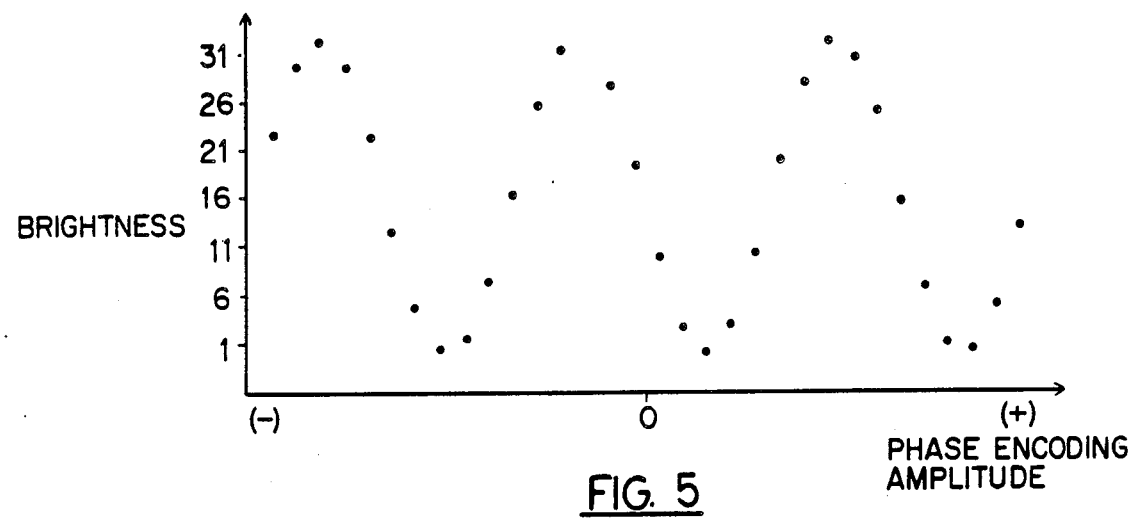
FIG. 5 depicts object brightness versus phase-encoding amplitude for a scan in which the amplitude of the phase-encoding gradient is implemented monotonically in the manner illustrated in FIG. 3.

For the simple 32-view example described hereinbefore, if the typical monotonic phase-encoding order (FIG. 3) is applied, the relationship between source brightness and phase encoding is as shown in FIG. 5. Each point in FIG. 5 is generated by finding, for each view, the brightness value in FIG. 4 and the phase encoding in FIG. 3. The location of the ghosts is determined by the frequency content of this relationship between brightness and phase encoding.

One possible way to reduce the disturbing effects of ghosts, disclosed and claimed in afore-identified U.S. patent application Ser. No. 673,690 is to try to move the ghosts as far from the object as possible. According to Equation (10), that happens when the major component variation is at $N_v/2$ cycles per scan. If an object is moving in a nearly periodic manner at a frequency of $N_v/2$ cycles per scan, most of the variable energy in the pixels whose brightness is time varying will be at that frequency. If, in addition, the phase-encoding amplitudes are incremented monotonically, as is usually done, then the temporal brightness function translates simply into brightness as a function of phase encoding. The net result is that the ghosts will be as far from the object as possible, FOV/2. In a conventional imaging sequence using one pair of phase-alternated RF excitation pulses (chopper pair), this relationship is accomplished when $T_R$ is equal to the breathing period divided by 4. The extra factor of 2 is due to the use of two phase-alternated RF excitation experiments per phase-encoding amplitude. Thus, a prior art method of controlling the effects of periodic motion is to choose a repetition time $T_R$ (FIG. 2) once the motion period is known.

The method of the invention will be disclosed first in general terms. To this end, the view increment time $T_v$ (FIG. 2) is defined to be the time between increments in the phase-encoding amplitude. The increment time $T_v$ is equal to the repetition time $T_R$ times the number of NMR experiments at each phase-encoding gradient amplitude. For example, in FIG. 2 there are two experiments in each view.

It should be recalled that it is not the brightness as a function of time but the brightness as a function of phase-encoding amplitude that determines the characteristics of the ghosts. The general object of the inventive method is to select the temporal order in which the phase-encoding amplitudes are applied so as to produce a relationship between object brightness and phase encoding that minimizes the disturbing effects. Within limits, a view order (temporal sequence in which phase-encoding gradient amplitudes are implemented) can be chosen so as to make the variation as a function of phase encoding be at any frequency.

One embodiment of this invention is to use the a-priori knowledge of $T_v$ (since it is under operator control) and the period of the object variation (for example the breathing period measured by any convenient method) to choose a view acquisition order prior to the start of the scan. Several methods for the selection of this view order will be described hereinbelow. During the scan the view order is implemented and the imaging data are acquired.

Two embodiments of the invention will be discussed below in greater detail. In the fist embodiment, the view order is chosen so as to make the motion period appear to be equal to the total scan time. This "low frequency sort" mode attempts to bring the ghosts as close to the object as possible. In another embodiment, the view order is chosen to make the motion period appear to be equal to $2T_v$. This "high frequency sort" mode attempts to push the ghosts as far away from the object as possible.

Figure 6:
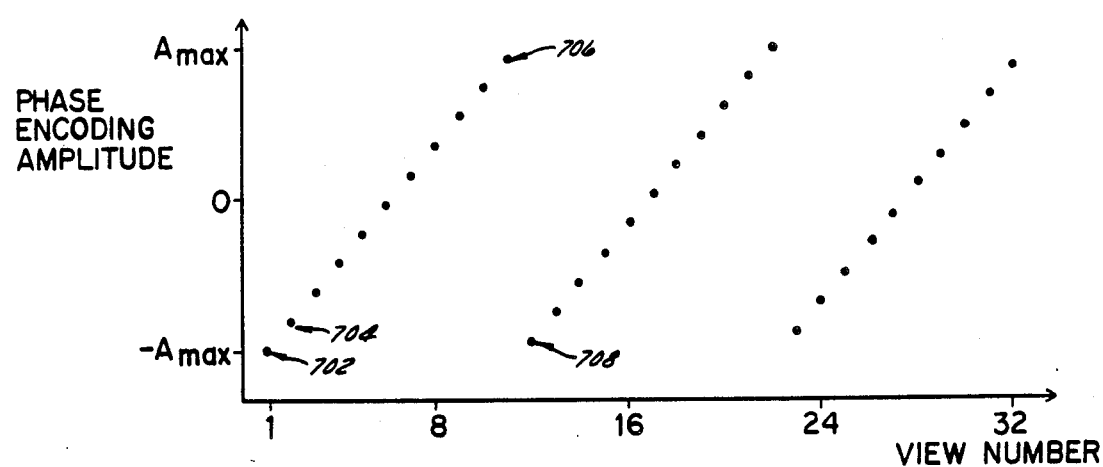
FIG. 6 depicts phase-encoding amplitude for each view in accordance with the low frequency mode embodiment of the inventive method.
Figure 7:
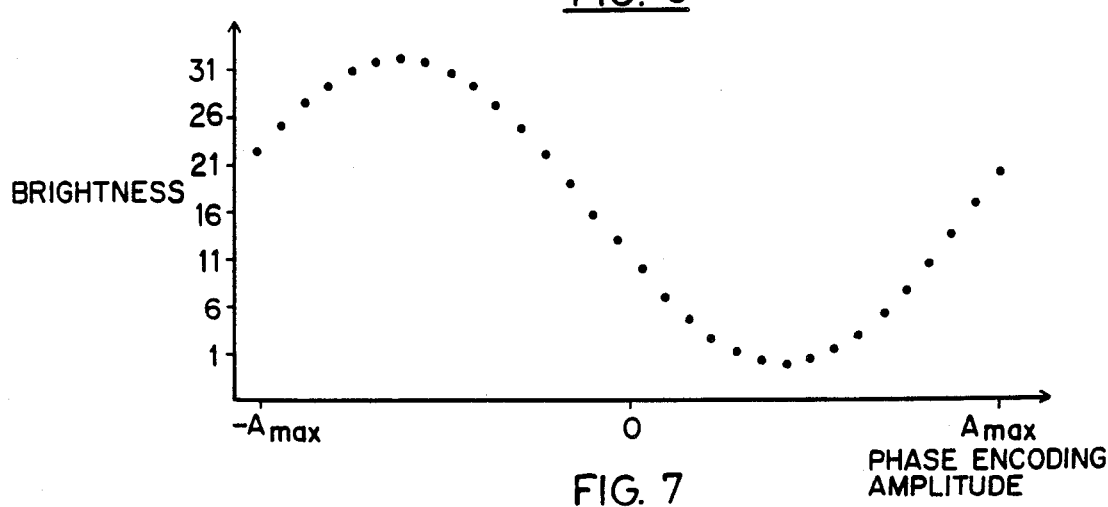
FIG. 7 shows object brightness as a function of phase-encoding amplitude for the embodiment of FIG. 6.

The objective of the low frequency sort mode is to choose a view order so that after the measurement data acquired in each view is reordered, the motion will appear to go through only one cycle. One possible way to accomplish this is by using the view order depicted in FIG. 6 which shows the phase-encoding amplitude for each view. The view order of FIG. 6 will be used instaed of that of FIG. 3. The process by which the view order of FIG. 6 was generated will be described below. The view order of FIG. 6 can be combined with FIG. 4 to produce FIG. 7 which shows pixel brightness as a function of phase-encoding gradient amplitude. It is this relationship that defines the character of the ghost artifacts. Since the function shown in FIG. 7 is a low frequency one, the resulting ghosts will be spatially close to the source pixel. This should be compared to FIG. 5, in which pixel brightness goes through several cycles as phase-encoding gradient amplitude is sequenced monotonically and therefore the ghosts extend farther from the source pixel.

Figure 8:
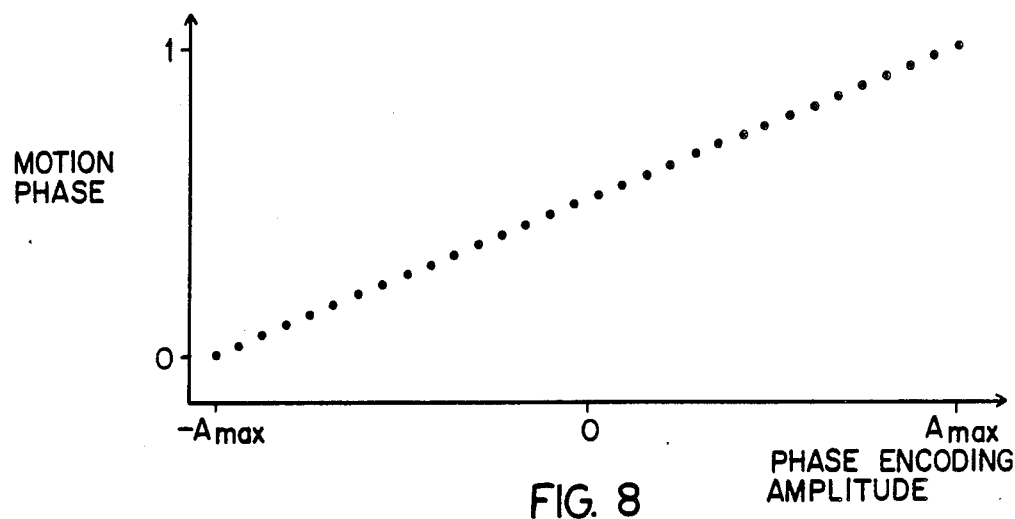
FIG. 8 illustrates a plot of motion phase versus phase-encoding amplitude for the embodiment discussed with reference to FIG. 6.

The generation of the view order of FIG. 6 will now be described. Given the motion period $T_B$ and the view increment time $T_v$, the relative phase of each view within the motion cycle can be calculated:

$$P(j) = \frac{1}{T_B} \text{MOD}((j-1)T_v + T_o, T_B), \quad (11)$$

where MOD (x,y) is the smallest positive number such that y=kx+MOD (x,y) for an integer K. The relative motion phase will also be referred to herein as the motion phase and the phase of the signal variation. For now, assume that $T_o$ is equal to zero and that the relationship between $T_v$ and $T_B$ is as shown in FIG. 4 (i.e., $T_v/T_B = 3/32$). Then, using Equation (11) the relative motion phase for the first view is zero, it increases linearly for each subsequent view by $T_v/T_B$ until for the 12th view the relative phase is again close to zero. From this new value the relative phase again increases by $T_v/T_B$ for subsequent views, and so on. The desirable characteristic of the relative motion phase as defined by Equation (11) is that, independent of the details of the periodic variation, the object's appearance in views with similar relative phase will be similar. The desired final relationship between relative motion phase and phase-encoding amplitude is now selected. In this relationship all values of phase-encoding amplitudes must be included so that a proper image can be generated, and all values of motion phase must be included unless some form of gating is to be used. For the low frequency sort embodiment, one possible relationship is shown in FIG. 8. Since there is a monotonic relationship between motion phase and phase encoding in the scan data, the object will appear to only experience one cycle of variation. A similar effect would be obtained in the case of motion phase that is monotonically decreasing as a function of phase-encoding amplitude, as well as in other relationships that will be obvious to those skilled in the art. The lowest (most negative) phase-encoding amplitude is assigned to the view with the lowest relative phase, the second lowest phase encoding to the view with the next lowest motion phase, and so on. The view with the largest relative phase is assigned the most positive phase encoding. In other words, each view is assigned a phase-encoding amplitude in proportion to its rank in motion phase. Thus, if $\text{RANK}_L(j)$ is the rank of the phase of the j-th acquired view ($1 \leq \text{RANK}_L(j) \leq N_v$), then the phase-encoding amplitude for this view is:

$$A(j) = -A_{max} + \frac{2A_{max}}{N_v - 1} \{\text{RANK}_L(j) - 1\}, \quad (12)$$

where, for this example, $A_{max}$ is the most positive phase encoding and $-A_{max}$ is the most negative phase encoding. For the 32-view example, the resulting relationship between phase-encoding amplitude and view number (or time) is shown in FIG. 6.

It will be recognized that whatever order in which the views are implemented, the measured data will have to be reordered so as to make the phase-encoding amplitude be monotonic prior to reconstructing the image (i.e., taking the inverse Fourier transform in the 2FT method). When this is done for the 32-view example, the resulting brightness for each phase-encoding amplitude is as shown in FIG. 7. FIG. 7 is generated by looking up, for each view, a brightness value in FIG. 4 and a phase-encoding amplitude in FIG. 6. It will be seen that, whereas the brightness was varying at a rate of 3 cycles per scan (FIG. 4), the apparent frequency has been changed to one cycle per scan (FIG. 7) by suitably choosing the order in which the phase-encoding amplitudes are applied. As a result of making the motion appear to cover only one cycle during the scan, the ghosts should be within a few pixels of any source point. Structures far from moving objects should be undisturbed.

The effect of changing $T_o$ in Equation (11) is to change the starting phase of the final relationship between brightness and phase encoding (FIG. 7). The apparent frequency would still be one cycle per scan. This is the same effect that would be had if the starting phase of the original brightness variation, FIG. 4, were changed. It has been found that this starting phase does not greatly affect the resulting image. Thus, to practice the present embodiment, it is not necessary to know the phase of the periodic variation, only its frequency.

Note that no assumption has been made as to the characteristics of the brightness variation other than substantial periodicity. If more knowledge is available about the brightness as a function of phase, then the ranking can be done according to brightness rather than phase and better performance should result. For example, in the 32-view case, if it were known that the brightness variation were sinusoidal and if the absolute phase of the sinusoid at the start of the scan were also known, the fact that each brightness value occurs twice and at known phases within each cycle could be used to rank the views according to object brightness rather than relative phase. If this were done, FIG. 7 would cover one half of one cycle rather than one full cycle and as a result the ghosts would be even closer to the source pixel. Again, for this to be possible knowledge of not only the motion period but also the absolute phase within the motion cycle at the start of the scan is needed. Also, since in general many pixels within the object will exhibit variation, the variation at each pixel can have a different amplitude but all variations must have the same general pattern (e.g., sinusoidal) and be at the same phase.

In accordance with the high frequency sort embodiment, a phase encoding gradient order is selected so that, after the data are reordered prior to reconstruction, the motion appears to be at the highest possible frequency. The motiviation toward a high frequency sort is to improve the image quality in the neighborhood of the varying pixels by displacing the ghosts as far as possible.

Figure 9:
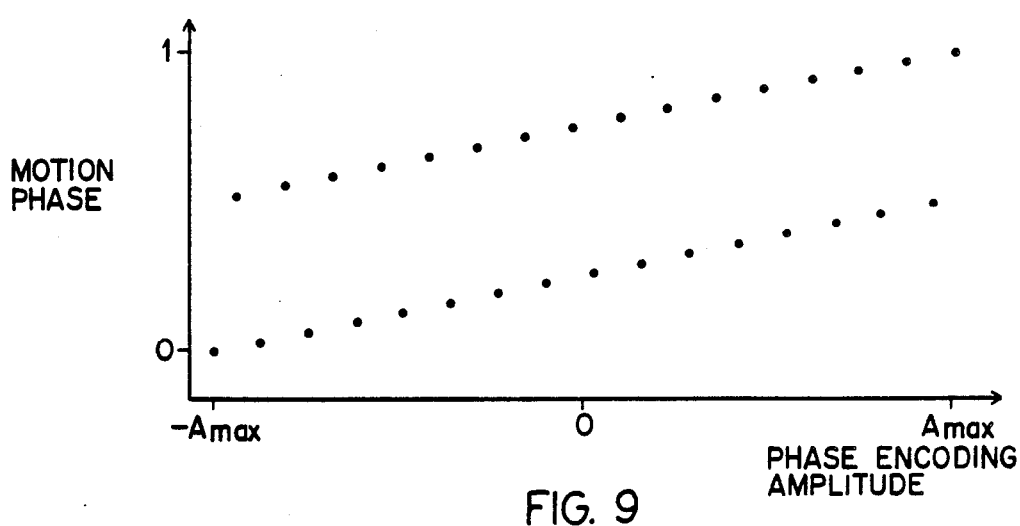
FIG. 9 shows the relationship between motion phase and phase-encoding amplitude for the high frequency sort mode embodiment of the inventive method.

Again, the desired final relationship between motion phase and phase encoding is first selected. One way to make the scan data represent a rapidly varying object is as shown in FIG. 9. It will be seen that the object will appear to vary by approximately one-half cycle between adjacent phase-encoding values. This can be accomplished by first ranking the views according to increasing relative motion phase as in the low frequency embodiment, and then reordering these so as to interlace the first and second halves. Thus, if $\text{RANK}_L(j)$ is as defined above for the low frequency embodiment, let $$R_H(j) = \begin{cases} 2RANK_L(j) - 1 & \text{for } RANK_L(j) \leq N_v/2 \\ 2RANK_L(j) - N_v & \text{otherwise} \end{cases} \quad (13)$$

It is seen that the views whose rank is in the lower 50 percent are reassigned the odd locations in $R_H$ while the views in the upper half in rank are assigned the even locations in $R_H$. Next, phase-encoding amplitudes are assigned in proportion to $R_H$:

$$A_H(j) = -A_{max} + \frac{2A_{max}}{N_v - 1}(R_H(j) - 1). \quad (14)$$

Figure 10:
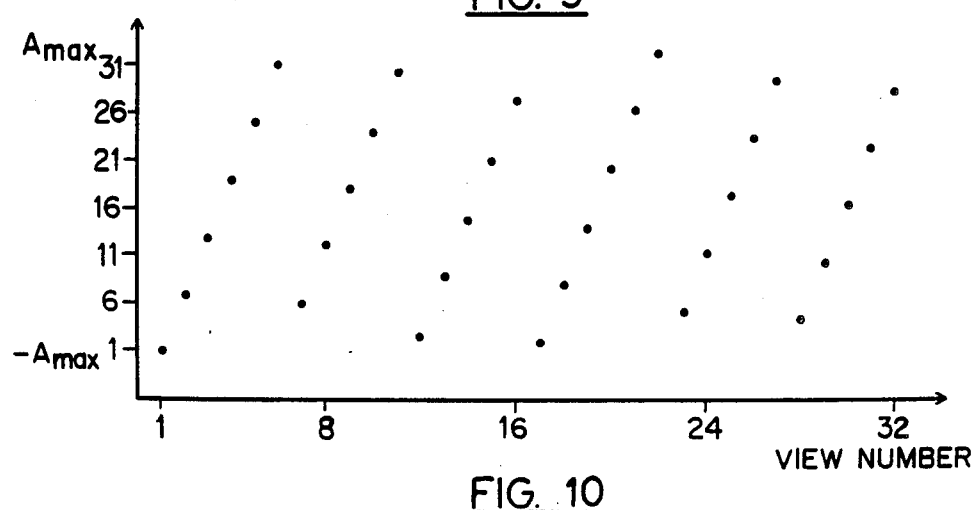
FIG. 10 depicts the order of phase-encoding amplitudes for the high frequency sort embodiment.
Figure 11:
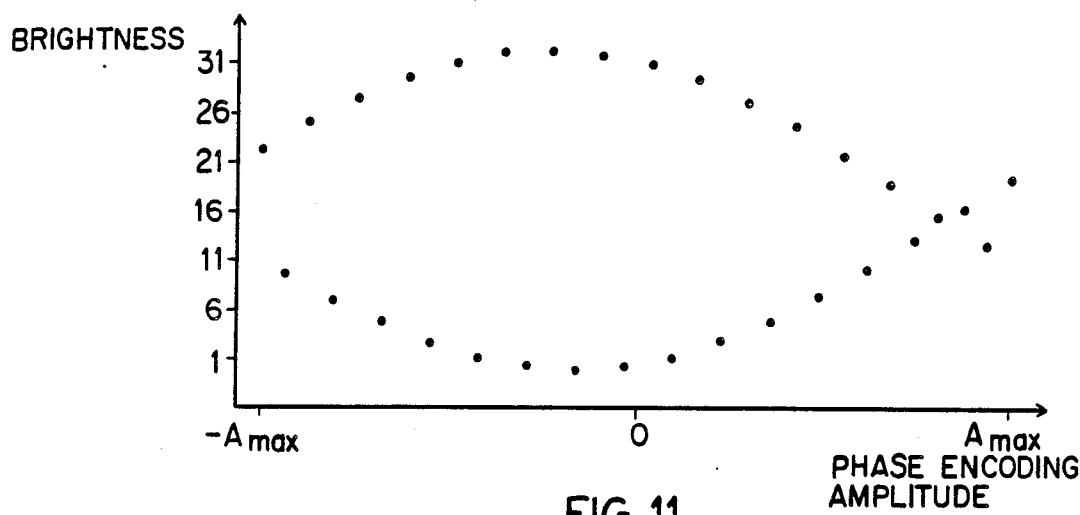
FIG. 11 shows the relationship between brightness and phase-encoding amplitude for the high frequency mode embodiment.

For the 32-view example, this order of phase-encoding amplitudes is shown in FIG. 10. When combined with the brightness as a function of view number of FIG. 4 the relationship between brightness and phase-encoding shown in FIG. 11 is obtained. Because FIG. 11 hs primarily high frequency components, the ghosts will be displaced as far as possible (FOV/2) from the source pixel.

Figure 12:
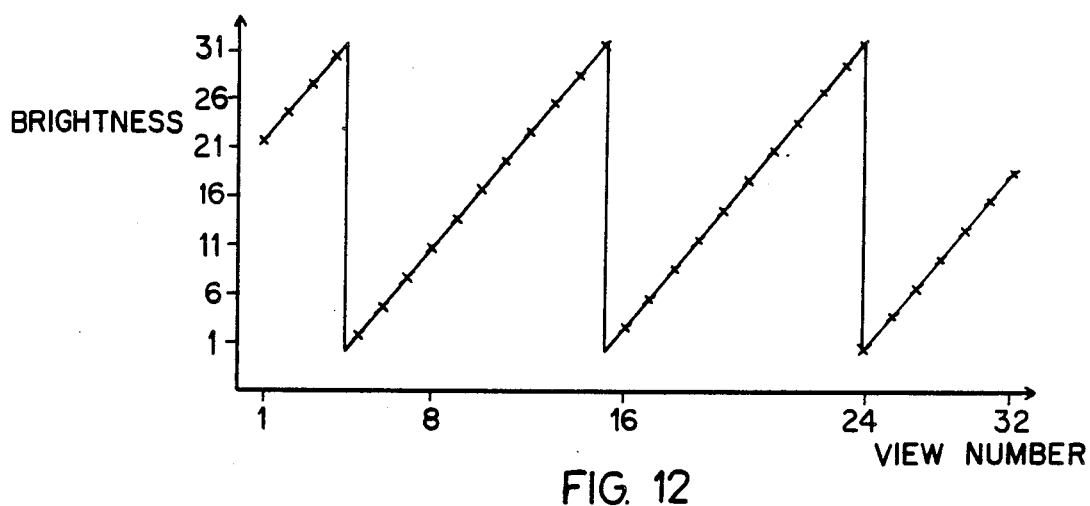
FIG. 12 illustrates several cycles of object brightness and having less symmetry than the waveform depicted in FIG. 4.
Figure 13:
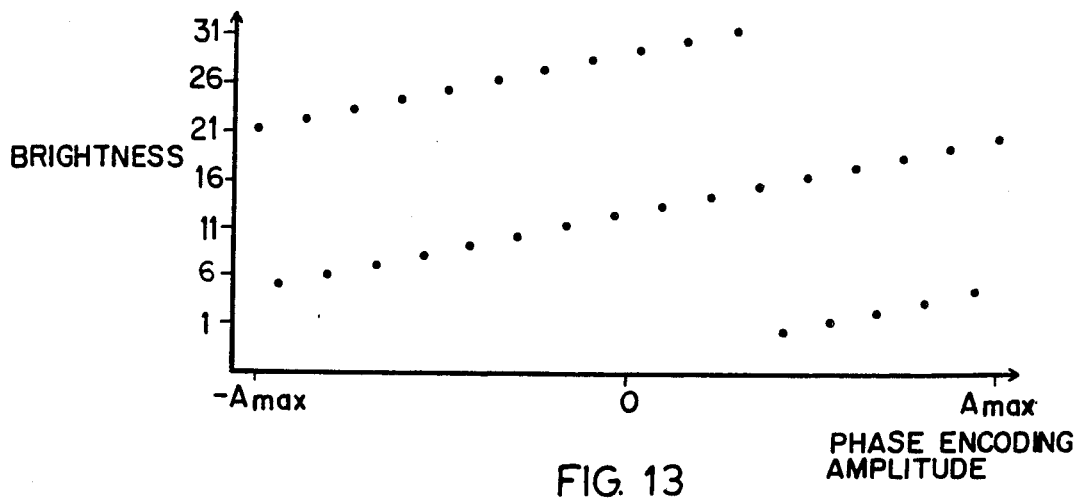
FIG. 13 shows the relationship between object brightness and phase-encoding amplitude for object brightness variation pattern depicted in FIG. 12.
Figure 14:
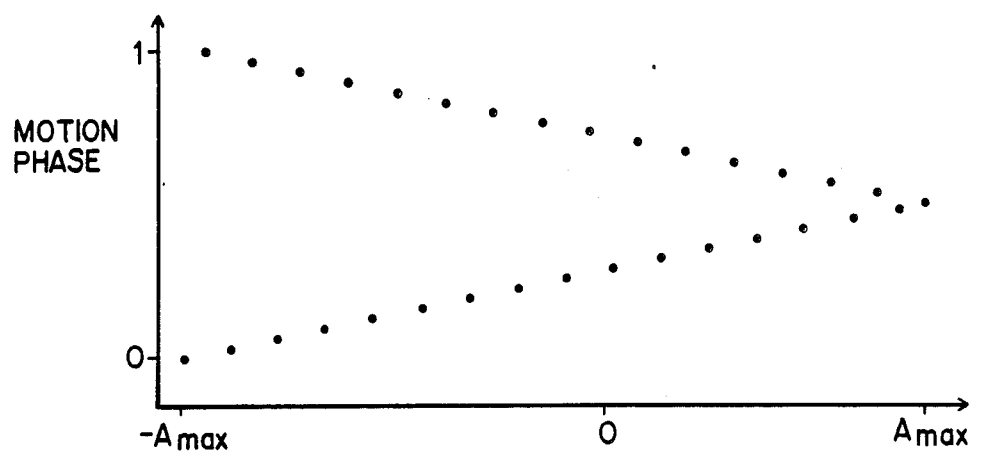
FIG. 14 shows the relationship between motion phase and phase-encoding amplitude for the high frequency sort embodiment.

For a brightness variation pattern that has less symmetry than a sinusoid, the brightness as a function of phase encoding would still contain some low frequency content. For example, if the sine wave of FIG. 4 were replaced by the sawtooth of FIG. 12, the resulting relationship between brightness and phase encoding would be that shown in FIG. 13. Residual low frequency components can be seen in FIG. 13 as a slow upward trend from left to right. These residual low frequency components derive from the low frequency components in FIG. 9. While the strong high frequency components in FIG. 13 indicate that much of the ghost energy will be displaced far from the source pixel, the residual low frequency components will cause there to be some residual effects near the source pixel, although less than in a low frequency sort. This performance can be further improved by using the relationship between motion phase and phase encoding as shown in FIG. 14. It will be seen that what needs to be done is to reverse the order of assignments of the views whose rank in motion phase is in the upper half. Thus, let $$R_H'(j) = \begin{cases} 2RANK_L(j) - 1 & \text{for } RANK_L(j) \leq N_v/2 \\ 2[N_v - RANK_L(j) + 1] & \text{otherwise} \end{cases} \quad (15)$$

and the phase encoding value for the j-th view, $A_H'(j)$ is $$A_H' = -A_{max} + \frac{2A_{max}}{N_v - 1}(R_H'(j) - 1). \quad (16)$$

Figure 15:
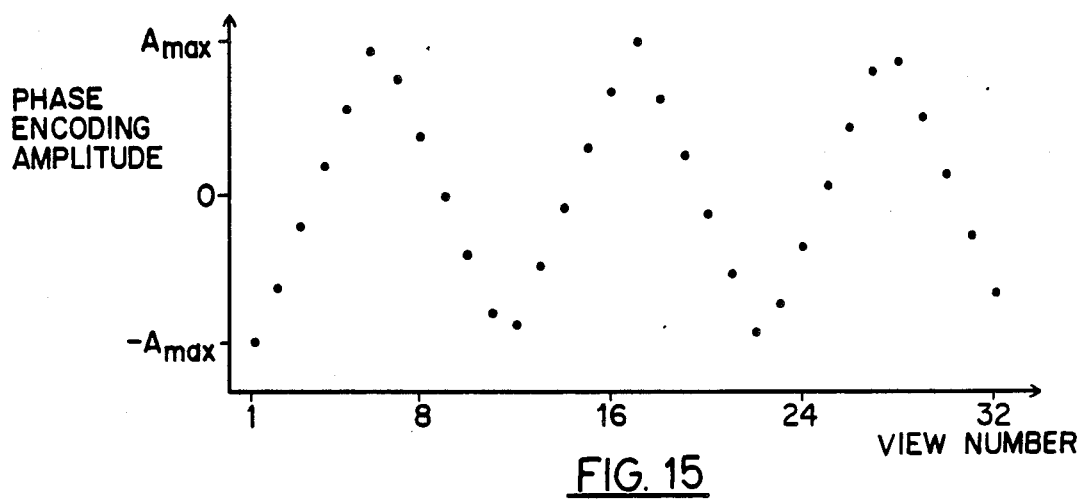
FIG. 15 depicts phase-encoding amplitude versus view number for another high frequency sort embodiment.
Figure 16:
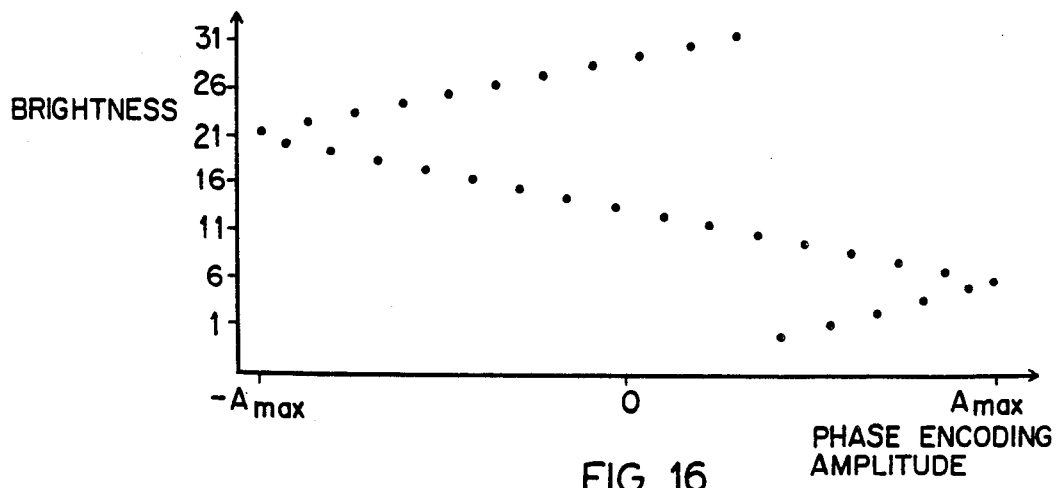
FIG. 16 shows a plot of brightness versus phase-encoding amplitude for the high frequency sort embodiment of FIG. 15.

For the 32-view example with $T_v/T_B = 3/32$ the resulting order of phase-encoding amplitudes is shown in FIG. 15. If FIG. 15 is combined with the sawtooth variation of FIG. 12 the result will be FIG. 16 which shows decreased residual low frequency content. As a result, the neighborhood of the source pixel will be less contaminated with ghosts.

The high frequency sort methods maximize the distance between the object and the ghost, but unless the scanned field is significantly larger than the object's size, ghosts could still fall on the desired portions of the image. The scanned field of view may be increased by known techniques to provide space that does not contain interesting structures but into which ghosts can be thrown. During or after reconstruction this extra region can be discarded so that the ghosts will not be visible in the final image. The typical way to double the field of view is to double the number of views while the maximum phase-encoding amplitude $A_{max}$ is kept constant (the phase-encoding imcrement is halved). This ordinarily requires the scan time to be doubled if $T_v$ is kept constsnt.

A desirable method for increasing the field of view, in particular for doubling the field of view, is disclosed and claimed in U.S. patent application Ser. No. 673,691, filed Nov. 21, 1984 (assigned to the same assignee and which is incorporated herein by reference) and may be used to convert the factor of 2 normally alloted to removing signal baseline errors (the use of "chopper" pairs), as disclosed in previously referenced U.S. Pat. No. 4,443,760, into a doubling of the scanned field while still suppressing baseline effects. For example, instead of acquiring 128 chopper pairs, 256 views, each with a single excitation can be acquired in which the scanned field of view is doubled. This method avoids the doubling of the scan time and still allows the ghosts to be thrown outside the desired image region if a high frequency sort is used.

In both the low and high frequency sort embodiments, a situation may arise (because phase-encoding gradient amplitudes are not necessarily implemented monotonically) where a view employing a large amplitude phase-encoding gradient follows a view with a small amplitude phase-encoding gradient. Residual transverse magnetization resulting from the small amplitude phase-encoding pulse can corrupt the measurement from the large amplitude phase-encoding view with a concomitant deleterious effect on image quality. U.S. patent application Ser. No. 689,428, filed Jan. 7, 1985 (assigned to the same assignee as the present invention and which is incorporated herein by reference) discloses and claims a method for reducing the effects of residual transverse magnetization. One exemplary sequence for accomplishing this will be described next with reference to FIG. 17.

Figure 17:
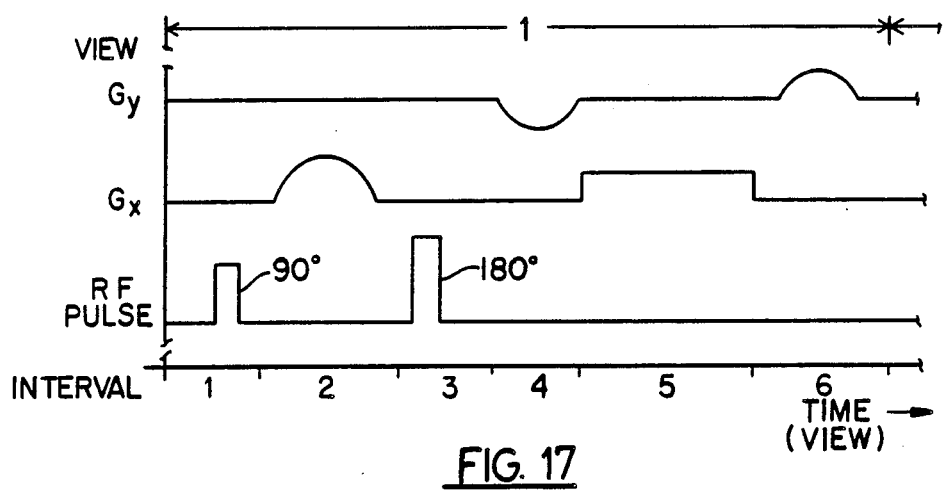
FIG. 17 depicts a portion of a pulse sequence useful with the invention to minimize the effects of residual transverse magnetization.

Referring now to FIG. 17, the deleterious effect of residual transverse magnetization due to imperfect 180° RF pulses is avoided by delaying the application of a phase-encoding $G_y$ gradient pulse until after the application of the 180° RF pulse in interval 3. Thus, the $G_y$ phase-encoding gradient pulse is applied in interval 4. Delaying the application of the phase-encoding pulse may increase the minimum echo delay time. However, the reversing $G_y$ pulse in interval 6 is highly effective in reversing the residual magnetization effects due to the $G_y$ pulse in interval 4. The result is that, regardless of the amplitude of the $G_y$ phase-encoding gradient pulse in interval 4, the magnetization is left in the same state following each view so that $G_y$ history does not affect the measurements.

In the example shown in FIG. 17, the reversing and phase-encoding gradient amplitudes are chosen so as to return the residual transverse magnetization to the state it would be in if no phase-encoding gradient had been used at all. In some applications, all that is required is that the residual transverse magnetization be left in the same state that is independent of the particular phase-encoding gradient amplitude used for that view. To do this, the sum of the amplitude of the phase-encoding gradient and the amplitude of the reversing gradient should be equal to a constant. In the example shown in FIG. 17, the constant has been chosen to be equal to zero. In any case, as the amplitude of the phase-encoding gradient varies, so does the amplitude of the reversing gradient.

The preferred embodiments of the invention have been disclosed hereinabove with reference to a 2DFT imaging sequence. The invention is, however, not so limited and may in fact be advantageously applied to other imaging pulse sequences such as, for example, the well-known two-dimensional (2D) and three-dimensional (3D) implementations of multiple angle projection reconstruction technique. Although the discussion will be limited to 2D projection reconstruction, the generalization to 3D will be understood by those skilled in the art. In 2D projection reconstruction NMR imaging, projection measurements are made at many (usually equally spaced) angles in a 180° degree arc. For example, projection data could be meausred at one degree increments. For each of these projection measurements or views, the readout gradient direction is perpendicular to the desired projection direction. Thus, the parameter that varies from view to view is the direction of the readout gradient (analogous to the phase-encoding amplitude is 2D FT imaging). The image is reconstructed by filtering and back projecting the line integral data obtained for each direction. In projection reconstruction, it is well known from computerized tomography (CT) scanning art that inconsistencies in the projection data, for example those due to periodic motion, are usually manifested in the image as streaks tagential to the moving (or otherwise varying) object. However, it is known that the reconstruction process is relatively insensitive to motion (or other variation) that appears as a single full cycle as a function of projection direction. The method of the invention is directly applicable to the multiple projection reconstruction data if the projection angle is treated in a manner analogous to the phase-encoding gradient described hereinabove. For projection reconstruction, the low frequency sort method is preferred. That is, the projection measurements, rather than being acquired sequentially at one degree intervals, are acquired in a low frequency sort order so that plot of pixel brightness versus projection angle is similar to that of FIG. 7. As before, the goal with low frequency sort is to select porjection directions so that the motion period appears to be equal to scan time. If the number of views used in projection reconstruction is comparable to or larger than the number of pixels across the field of view, the high frequency sort method may also be used, since for this case it is known that the consistent rapid variation between adjacent views will cause streaks in the reconstructed image that will be visible only far from the source pixel.

In cases where the number of cycles of signal variation during the scan (either using projection reconstruction or the FT method) is an integer, as it is in the 32-view example described above where there were 3 cycles (FIG. 5), the order in which the gradient parameters values are applied will be quite regular. If there were N cycles during the scan and if a low frequency sort is used, views that are temporally adjacent will likely be N values apart in the gradient parameter. Referring to FIG. 6, it will be seen that, except for edge effects at the top and bottom of the graph ($+A_{max}$ and $-A_{max}$, respectively), adjacent views are 3 phase-encoding values apart. For example, the first view is assigned the most negative phase encoding ($-A_{max}$). This point is designated by reference number 702 in FIG. 6. The next view is assigned the fourth most negative phase encoding as indicated by reference number 704. The next view is assigned the seventh most negative value, and so on. The eleventh view is assigned a very positive phase encoding as shown by reference numeral 706. There is no higher phase-encoding value that is 3 values higher than that designated by reference number 706. Thus, the next view is assigned a very negative phase-encoding value that is as yet unassigned. In the example shown in FIG. 6, the second most negative phase-encoding amplitude was selected as is shown by reference number 708 and indeed this choice optimizes the low frequency behavior of the relationship depicted in FIG. 7. However, if the third most negative value had been used, the effect on the final result would be small. Thus, in the "skip-by-N" method presently being described, an arbitrary choice of starting point can be made when an edge effect is encountered.

If a high frequency sort is used, temporally adjacent views will likely have gradient parameter values that are 2N apart. This may be appreciated by reference to FIG. 10. The first view is assigned the most negative phase encoding, the second view is assigned the seventh most negative value, and so on.

A further requirement for a "skip-by-2N" high frequency sort embodiment is that, if an odd ordered starting phase-encoding value is assigned at one edge effect point, an even ordered one must be assigned at the next such edge effec. Thus, the first view was assigned the first (an odd number) phase-encoding value. This point is indicated by reference numeral 1002 in FIG. 10. At the next edge effect point, the sixth (an even number) phase-encoding value is assigned, as denoted by reference numeral 1004 in FIG. 10. Again, while using the sixth value here is optimal, the second or fourth values could be used with only minor impact. However, it is important that odd and even starting values be alternated since it is this effect, coupled with the fact that the motion phase at alternate transition points is one-half cycle apart, that results in a high frequency sort.

Thus, a simple implementation of the invention includes the steps of approximating the signal variation during the scan as an integer number of cycles N (where $N = T_B/T_v$) and assigning to temporally adjacent views gradient parameter values that are either N (for a low frequency sort mode) or 2N (for a high frequency sort mode) values apart.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed is:

1. A method for reducing artifacts in a desired image due to unwanted substantially periodic signal variations of NMR signals sensed in a plurality of views of a portion of an object being examined using nuclear magnetic resonance techniques, each view including irradiation of the object portion by an RF excitation pulse at the Larmor frequency to produce one of said NMR signals, said technique including application of a pulsed magnetic field gradient for spatial encoding along at least one dimensional axis of the object, said magnetic field gradient having a plurality of spatial encoding parameter values, each value corresponding to a respective view so as to encode spatial information into said NMR signals, said method comprising the steps of:
(a) determining a period $T_B$ of said unwanted signal variations; and
(b) selecting a temporal order of application of said gradient parameter values to produce a sequence of said NMR signals such that reordering of said NMR signals provides an apparent period of signal variation other than said period $T_B$.

2. The method of claim 1 wherein said signal variations are due to motion of the object being studied.

3. The method of claim 1 wherein said pulsed magnetic field gradient comprises a phase-encoding magnetic field gradient and wherein said spatial encoding parameter value comprises the time integral of the gradient pulse waveform.

4. The method of claim 3 wherein said time integral is controlled by the amplitude of said phase-encoding magnetic field gradient.

5. The method of claim 1, 3 or 4 wherein the temporal order of said gradient parameter value applied in the course of implementing said plurality of views is selected such that when measurements acquired in each view are rearranged in order of monotonically increasing parameter value, the signal variations as a function of gradient parameter value are of a lower frequency than the signal variations as a function of view number, thereby to decrease displacement of the artifacts from the desired image.

6. The method of claim 5 wherein the temporal order of said gradient parameter applied in the course of implementing said plurality of views is selected such that when the measurements acquired in each view are rearranged in order of monotonically increasing parameter value the signal variations will appear to go through no more than one cycle.

7. The method of claim 1, 3 or 4 wherein said step of selecting the temporal order of said gradient parameter value comprises:
(a) calculating for each of said plurality of views a relative phase of signal variation;
(b) assigning a different rank, $RANK_L(j)$, to each view in monotonic order of relative phase of signal variation; and
(c) assigning a different value of said gradient parameter to each view in proportion to the rank assigned thereto.

8. The method of claim 7 wherein the relative phase of signal variation, $P(j)$, is calculated using the equation $$P(j) = \frac{1}{T_B} \text{MOD}((j-1)T_v + T_o, T_B),$$

in which MOD (x,y) is the smallest positive number such that $y = kx + MOD(x,y)$ for an interger k, $T_v$ is view increment time and $T_o$ is any number.

9. The method of claim 7 wherein said adjustable parameter comprises the amplitude of said phase-encoding magnetic field gradient, and wherein the amplitude, $A(j)$, implemented in each view is calculated using the equation $$A(j) = -A_{max} + \frac{2A_{max}}{N_v - 1} (RANK_L(j) - 1),$$

in which
$A_{max}$ is the maximum phase-encoding amplitude; and
$N_v$ is the total number of views.

10. The method of claim 1 wherein said step of selecting a temporal order includes
(a) selecting an integer N such that N is approximately equal to $T_B/T_v$, where $T_v$ is view increment time; and
(b) assigning gradient parameter values to temporally adjacent ones of said plurality of views such that the parameter value assigned to each view differs from that assigned to a temporally adjacent view by approximately N.

11. The method of claim 1, 3 or 4 wherein the temporal order of said gradient parameter applied in the course of implementing said plurality of views is selected such that when measurements acquired in each view are rearranged in order of monotonically increasing parameter value, the signal variations as a function of gradient parameter value are of a higher frequency than the variations as a function of view number, thereby to increase displacement of the artifacts from the desired image.

12. The method of claim 11 wherein the temporal order of said gradient parameter applied in the course of implementing said plurlity of view is selected such that when the measurements acquired in each view are rearranged in order of monotonically incrasing parameter value the signal variations will appear to go through $N_v/2$ cycles, where $N_v$ is equal to the number of views comprising said plurality of views.

13. The method of claim 1, 3 or 4 wherein said step of selecting the temporal order of said gradient parameter value comprises:
(a) calculating for each of said plurality of views a relative phase of signal variation;
(b) assigning a different rank, $RANK_L(j)$, to each view in monotonic order of relative phase of signal variation; and
(c) assigning a different rank, $RANK_H(j)$, to each view wherein $RANK_H(j)$ is determined by:

$$R_H(j) = \begin{cases} 2RANK_L(j) - 1 & \text{for } RANK_L(j) \leq N_v/2 \\ 2RANK_L(j) - N_v & \text{otherwise} \end{cases} ;\text{and}$$

(d) assigning a different value of said gradient parameter to each view in proportion to the value of $R_H$ assigned thereto.

14. The method of claim 13 wherein the phase-encoding amplitude for the j'th view, $A(j)$, is calculated using $$A_H(j) = -A_{max} + \frac{2A_{max}}{N_v - 1} (R_H(j) - 1),$$

where $A_{max}$ is the maximum phase-encoding amplitude and $N_v$ is the total number of views.

15. The method of claim 1, 3 or 4 wherein said step of selecting the temporal order of said gradient parameter value comprises:
(a) calculating for each of said plurality of views a relative phase of signal variation;
(b) assigning a different rank, $RANK_L(j)$, to each view in monotonic order or relative phase of signal variation; and (c) assigning a different rank, $RANK_H(j)$, to each view wherein $RANK_H(j)$ is determined $$R_H(j) = \begin{cases} 2RANK_L(j) - 1 & \text{for } RANK_L(j) \leq N_v/2 \\ 2[N_v - RANK_L(j) + 1] & \text{otherwise} \end{cases};$$

(d) assigning a different value of said gradient parameter to each view in proportion to the rank assigned thereto.

16. The method of claim 15 wherein the phase-encoding amplitude for the j'th view, $A(j)$, is calculated using $$A_H(j) = -A_{max} + \frac{2A_{max}}{N_v - 1}(R_H(j) - 1),$$

where $A_{max}$ is the maximum phase-encoding amplitude and $N_v$ is the total number of views.

17. The method of claim 1 wherein said step of selecting a temporal order includes
(a) selecting an integer N such that N is approximately equal to $T_B/T_v$, where $T_v$ is view increment time; and
(b) assigning gradient parameter values to temporally adjacent ones of said plurality of views such that the parameter value assigned to each view differs from that assigned to a temporally adjacent view by approximately 2N.

18. The method of claim 1 wherein said magnetic field gradient comprises a read-out magnetic field gradient and wherein the adjustable parameter value comprises the direction of said read-out gradient.

19. The method of claim 18 wherein the temporal order of said gradient parameter value applied in the course of implementing said plurality of views is selected such that when measurements acquired in each view are rearranged in order of monotonically increasing parameter value, the signal variations as a function of gradient parameter value are of a lower frequency than the signal variations as a function of view number, thereby to decrease displacement of the artifacts from the desired image.

20. The method of claim 19 wherein the temporal order of said gradient parameter applied in the course of implementing said plurality of views is selected such that when the measurements acquired in each view are rearranged in order of monotonically increasing parameter value the signal variations will appear to go through no more than one cycle.

21. The method of claim 18 wherein said step of selecting the temporal order of said gradient parameter value comprises:
(a) calculating for each of said plurality of views a relative phase of signal variation;
(b) assigning a different rank, $RANK_L(j)$, to each view in monotonic order of relative phase of signal variation; and
(c) assigning a different value of said gradient parameter to each view in proportion to the rank assigned thereto.

22. The method of claim 21 wherein the relative phase of signal variation, $P(j)$, is calculated using the equation $$P(j) = \frac{1}{T_B} MOD((j-1)T_v + T_o, T_B),$$

in which MOD $(x,y)$ is the smallest positive number such that $y = kx + MOD(x,y)$ for an interger k, $T_v$ is view increment time and $T_o$ is any number.

23. The method of claim 18 wherein said step of selecting a temporal order includes
(a) selecting an integer N such that N is approximately equal to $T_B/T_v$ where $T_v$ is view increment time; and
(b) assigning gradient parameter values to temporally adjacent ones of said plurality of views such that the parameter value assigned to each view differs from that assigned to a temporally adjacent view by approximately N.

24. A method for reducing artifacts in a desired image due to unwanted, substantially periodic signal variations of NMR signals sensed in a plurality of views of a portion of an object being examined using nuclear magnetic resonance techniques, each view including irradiation of the object portion by an RF excitation pulse at the Larmor frequency to produce one of said NMR signals, said technique including application of a pulsed magnetic field gradient for spatial encoding along at least one dimensional axis of the object, said magnetic field gradient having a plurality of spatial encoding parameter values, each value corresponding to a respective view so as to encode spatial information into said NMR signals, said method comprising the steps of:
(a) selecting a relationship between the signal variations and the parameter value of said magnetic field gradient, such that the signal variations as a function of gradient parameter value are of a lower frequency than the variations as a function of view number; and
(b) selecting a temporal order of application of said parameter so as to approximate said relationship.

25. The method of claim 24 wherein said pulsed magnetic field gradient comprises a phase-encoding magnetic field gradient and wherein the parameter value comprises the time integral of the gradient pulse waveform.

26. The method of claim 25 wherein said time integral is controlled by the amplitude of said phase-encoding magnetic field gradient.

27. The method of claim 24 wherein the temporal order of said gradient parameter applied in the course of implementing said plurality of views is selected such that when the measurements acquired in each view are rearranged in order of monotonically increasing parameter value the signal variations will appear to go through no more than one cycle.

28. The method of claim 24, 25 or 26 wherein said step of selecting the temporal order of said gradient parameter value comprises:
(a) calculating for each of said plurality of views a relative phase of signal variation;
(b) assigning a different rank, $RANK_L(j)$, to each view in monotonic order of relative phase of signal variation; and
(c) assigning a different value of said gradient parameter to each view in proportion to the rank assigned thereto.

29. A method for reducing artifacts in a desired image due to unwanted, substantially periodic signal variations of NMR signals sensed in a plurality of views of a portion of an object being examined using nuclear magnetic resonance techniques, each view including irradiation of the object portion by an RF excitation pulse at the Larmor frequency to produce one of said NMR signals, said technique including application of a pulsed magnetic field gradient for spatial encoding along at least one dimensional axis of the object, said magnetic field gradient having a plurality of spatial encoding parameter values, each value corresponding to a respective view so as to encode spatial information into said NMR signals, said method comprising the steps of:

(a) selecting a relationship between the signal variations and the parameter value of said magnetic field gradient, such that the signal variations as a function of gradient parameter value are of a higher frequency than the variations as a function of view number; and (b) selecting a temporal order of application of said parameter so as to approximate said relationship.

30. The method of claim 29 wherein said pulsed magnetic field gradient comprises a phase-encoding magnetic field gradient and wherein the parameter value comprises the time integral of the gradient pulse waveform.

31. The method of claim 30 wherein said time integral is controlled by the amplitude of said phase-encoding magnetic field gradient.

32. The method of claim 29 wherein the temporal order of said gradient parameter applied in the course of implementing said plurality of views is selected such that when the measurements acquired in each view are rearranged in order of monotonically increasing parameter value the signal variations will appear to go through $N_v/2$ cycles, where $N_v$ is equal to the number of views comprising said plurality of views.

33. The method of claim 29, 30, or 31 wherein said step of selecting the temporal order of said gradient parameter value comprises:

(a) calculating for each of said plurality of views a relative phase of signal variation;

(b) assigning a different rank, $RANK_L(j)$, to each view in monotonic order of relative phase of signal variation; and (c) assigning a different rank, $RANK_H(j)$, to each view wherein $RANK_H(j)$ is determined $$R_H(j) = \begin{cases} 2RANK_L(j) - 1 & \text{for } RANK_L(j) \leq N_v/2 \\ 2[N_v - RANK_L(j) + 1] & \text{otherwise} \end{cases} ;$$

(d) assigning a different value of said gradient parameter to each view in proportion to the rank assigned thereto.

34. The method of claim 1, 24 or 29 further comprising the steps of:

(c) reordering said NMR signals according to a monotonic order of said spatial encoding gradient parameter; and (d) constructing said desired image from said reordered NMR signals.

* * * * *